(12) United States Patent
Malone et al.

(10) Patent No.: US 7,280,360 B2
(45) Date of Patent: Oct. 9, 2007

(54) SOCKET ADAPTED FOR COMPRESSIVE LOADING

(75) Inventors: Christopher G. Malone, Loomis, CA (US); Stephan K. Barsun, Sacramento, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 314 days.

(21) Appl. No.: 11/046,452

(22) Filed: Jan. 28, 2005

(65) Prior Publication Data

US 2006/0171122 A1    Aug. 3, 2006

(51) Int. Cl.
*H05K 7/20* (2006.01)

(52) U.S. Cl. ............... 361/704; 361/719; 165/80.2; 165/80.3; 257/706; 257/718; 257/719

(58) Field of Classification Search .............. None
See application file for complete search history.

(56) References Cited

U.S. PATENT DOCUMENTS

| | | | | |
|---|---|---|---|---|
| 4,414,562 A * | 11/1983 | Kiley et al. | ................ | 257/719 |
| 5,702,255 A * | 12/1997 | Murphy et al. | ............... | 439/71 |
| 5,772,451 A * | 6/1998 | Dozier et al. | ................. | 439/70 |
| 5,833,472 A | 11/1998 | Bright | | |
| 5,907,474 A | 5/1999 | Dolbear | | |
| 5,985,697 A | 11/1999 | Chaney et al. | | |
| 6,084,178 A | 7/2000 | Cromwell | | |
| 6,137,164 A * | 10/2000 | Yew et al. | ................... | 257/686 |
| 6,164,981 A * | 12/2000 | Lin et al. | ....................... | 439/70 |
| 6,212,070 B1 * | 4/2001 | Atwood et al. | ............. | 361/704 |
| 6,462,271 B2 | 10/2002 | Coffin et al. | | |
| 6,626,691 B2 * | 9/2003 | Yu | .............................. | 439/342 |
| 6,713,684 B2 | 3/2004 | Stone | | |
| 6,724,081 B2 * | 4/2004 | Ho et al. | ..................... | 257/718 |
| 6,740,820 B2 * | 5/2004 | Cheng | ......................... | 174/260 |
| 6,947,293 B2 * | 9/2005 | DiBene et al. | ............. | 361/803 |
| 6,975,518 B2 * | 12/2005 | Frutschy et al. | ............ | 361/769 |
| 7,095,619 B2 * | 8/2006 | Panella et al. | ............... | 361/760 |
| 7,159,313 B2 * | 1/2007 | Sathe et al. | ..................... | 29/846 |
| 2003/0106710 A1 * | 6/2003 | Cheng | ......................... | 174/261 |
| 2003/0150645 A1 * | 8/2003 | Chiu | ........................... | 174/264 |
| 2004/0056298 A1 | 3/2004 | Stone | | |
| 2004/0111876 A1 * | 6/2004 | Cheng | ......................... | 29/762 |
| 2005/0108877 A1 * | 5/2005 | Peterson | ................. | 29/890.03 |
| 2005/0122690 A1 * | 6/2005 | Hood et al. | ................. | 361/709 |
| 2006/0198107 A1 * | 9/2006 | Azar et al. | .................. | 361/704 |

FOREIGN PATENT DOCUMENTS

GB    2163287 A    2/1986

\* cited by examiner

*Primary Examiner*—Boris Chérvinsky

(57) ABSTRACT

A ball grid array (BGA) socket is adapted to receive and electrically connect to an integrated circuit disposed between a circuit substrate and a heat sink. An attachment element is adapted to hold the Socket BGA to the circuit substrate with a compressive load isolated from the heat sink.

22 Claims, 11 Drawing Sheets

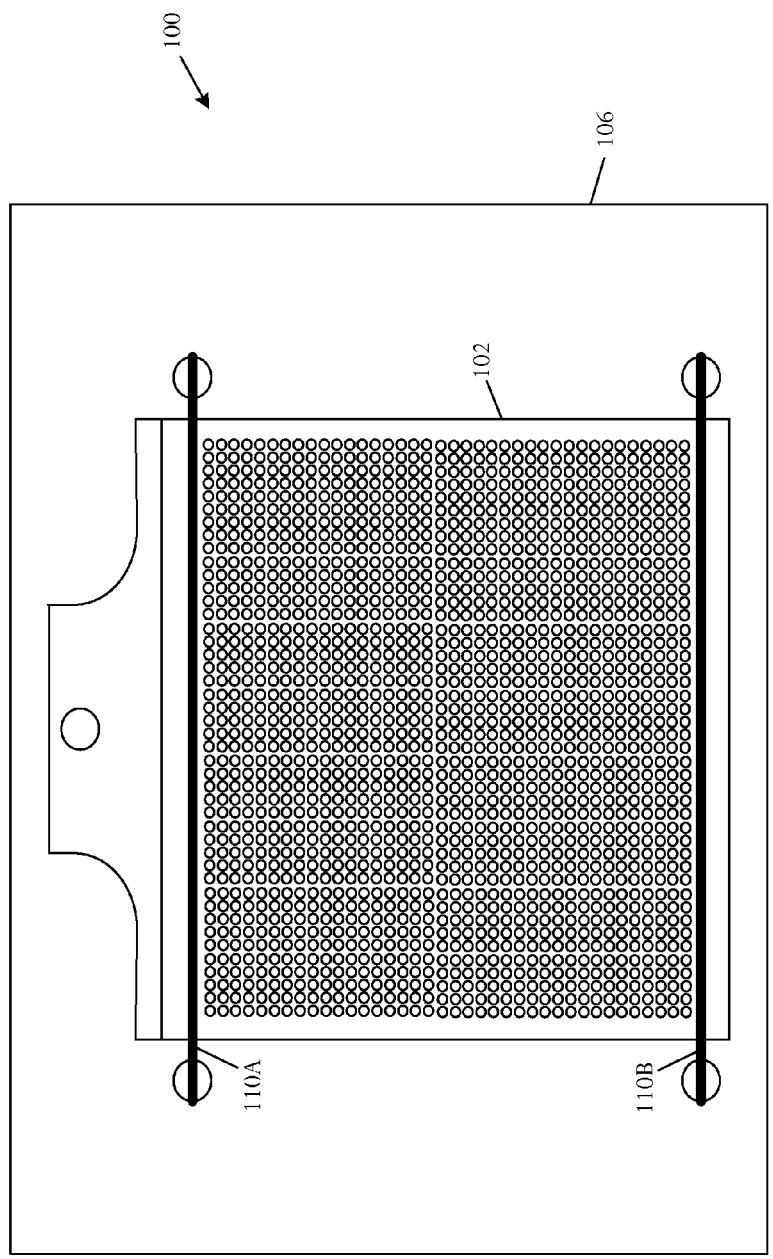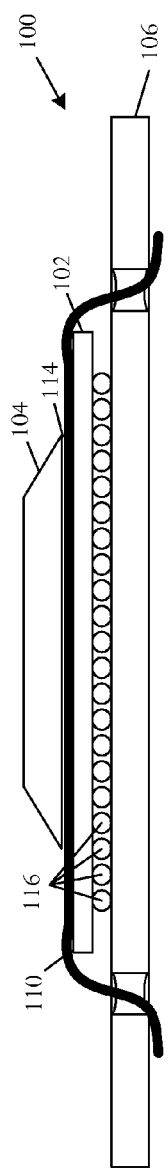
FIG. 1A
FIG. 1B

SOCKET ADAPTED FOR COMPRESSIVE LOADING

BACKGROUND

Packaged and assembled electronics devices and systems commonly include multiple integrated circuit chips, often with one or more high power level application specific integrated circuits (ASIC). A heat sink may be thermally-connected to an ASIC to address the high power level and related thermal dissipation.

The devices and systems typically also include one or more sockets for interconnecting the integrated circuits and a printed circuit board or motherboard. The socket enables communication between the integrated circuits and other installed components. Evolution in technology has increased the number of pins on the socket and communication speeds, increasing the difficulty of maintaining reliable signal connections.

SUMMARY

In an illustrative embodiment of an interface for usage in an electronic system, a ball grid array (BGA) socket is adapted to receive and electrically connect to an integrated circuit disposed between a circuit substrate and a heat sink. An attachment element is adapted to hold the Socket BGA to the circuit substrate with a compressive load isolated from the heat sink.

BRIEF DESCRIPTION OF THE DRAWINGS

Embodiments of the invention relating to both structure and method of operation, may best be understood by referring to the following description and accompanying drawings:

FIGS. 1A and 1B are simplified pictorial diagrams illustrating different views of an interface embodiment for usage in an electronic system to connect an integrated circuit to a ball grid array (BGA) socket;

DETAILED DESCRIPTION

Reliability of ball grid array electrical interconnects is enhanced if the socket is placed in a compressive load. In some configurations the load is applied by direct contact between a processor daughter card-heat sink assembly and the socket. For example, the heat sink may be attached to the daughter board by spring-loaded screws or a clip which transfers load to the socket.

Conversely, socket durability is found to be improved if a gap is interposed between the socket and an integrated circuit mounted in the socket. For example, an integrated circuit that electrically connects to a socket via an array of surface-mounted pins may be separated from the socket by a gap by the pins, isolating the mass of a heat sink applied to cool the integrated circuit from the socket and the integrated circuit. A configuration that forms a gap between the integrated circuit and socket cannot use the heat sink to apply the compressive load to the socket.

An electronic apparatus configuration enhances connective reliability by applying a compressive load to a socket ball grid array in a configuration that isolates loads applied by a heat sink which cools an integrated circuit mounted in the socket.

Figure 1C:
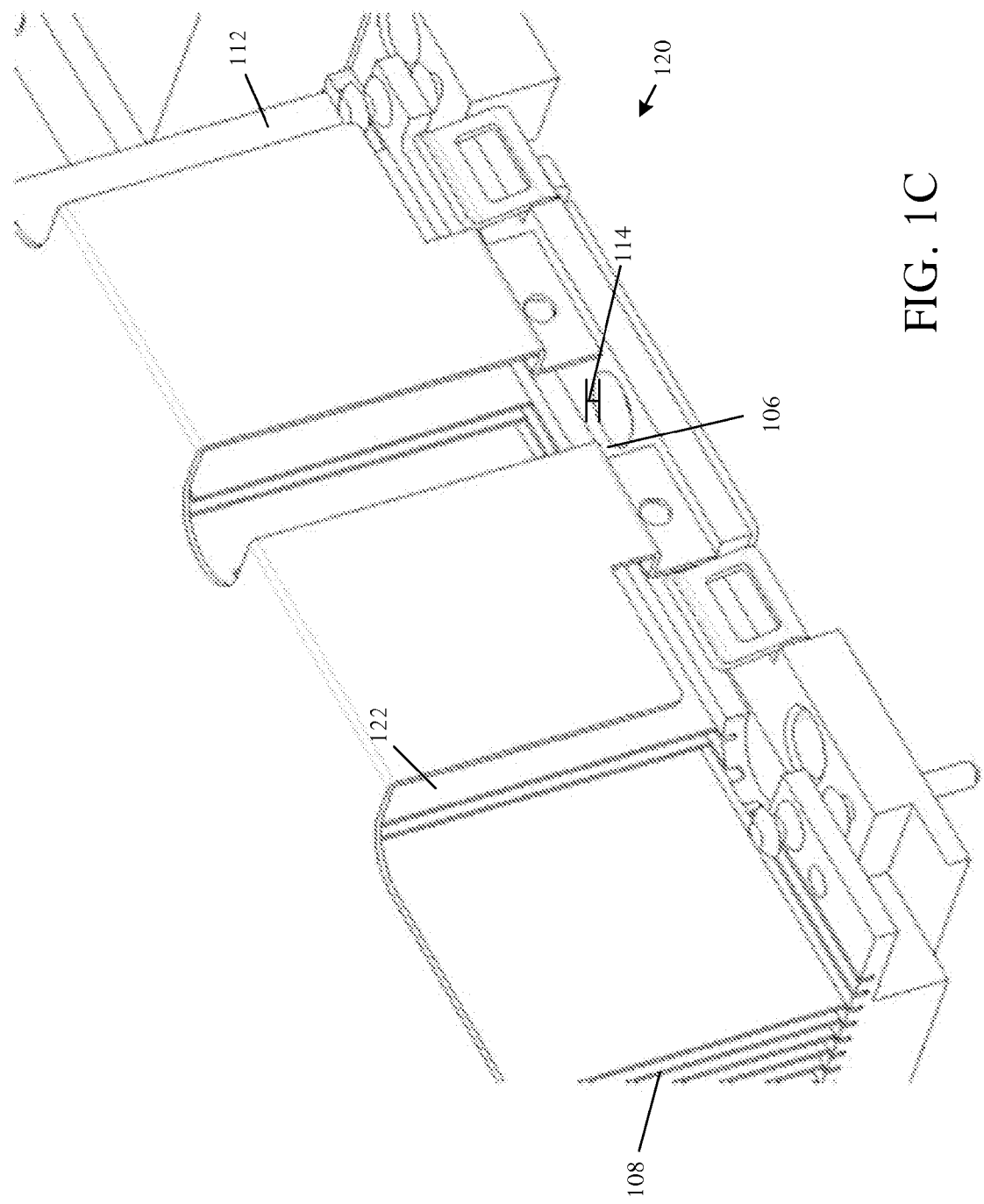
FIG. 1C is a perspective pictorial diagram illustrating an assembly which is configured to hold the interface shown in FIGS. 1A and 1B and applies a compressive load between a socket and printed circuit board which is isolated from a heat sink frame.

Referring to FIGS. 1A and 1B, simplified top and side pictorial views illustrate an embodiment of an interface 100 for usage in an electronic system. FIG. 1C is a perspective pictorial diagram illustrating the interface 100. A socket 102 is loaded separately from a heat sink 108. The interface 100 comprises a socket ball grid array (BGA) 102 adapted to receive and electrically connect to an integrated circuit 104 disposed between a circuit substrate 106 and a heat sink 108. An attachment element 110 is adapted to hold the socket BGA 102 to the circuit substrate 106 with a compressive load isolated from the heat sink 108.

Reliability of the socket BGA attachment is improved by applying the compressive load. The socket BGA 102 has solder balls 116 that connect to the circuit substrate 106, for example a printed circuit board. Reliability of the connections between the solder balls 116 and the circuit substrate 106 is improved in comparison to a socket attached without compression. The compressive load is applied directly to the socket 102, isolated from the heat sink 108, to protect against damage that may occur under shock conditions which may occur, even under normal operating conditions, when the heavy heat sink transmits excessive loads damaging to the integrated circuit and/or socket.

In an illustrative embodiment, the socket 102 implements a ball grid array (BGA) technology for connecting the integrated circuit 104 to the circuit substrate 106. BGA technology connects multiple lands or balls to a socket interface surface of the circuit substrate. Corresponding multiple pads are arranged on a package interface surface of the socket. A compressive load applied to the socket and/or circuit substrate forces the lands or balls into electrical contact with the socket pads.

The integrated circuit 104 is connected to metallic balls that function as leads and arranged in a grid on a face of a ceramic substrate in the socket 102. The socket BGA 102 is mounted directly on the circuit substrate 106, typically using surface mount techniques to bond the balls to a corresponding array of pads on the circuit substrate 106. The metallic balls are commonly constructed from a material such as solder alloy. In some embodiments, the balls may be attached to the circuit substrate 106 via a solder paste which may be formed on the pads. Solder is reflowed using a heating process so that the balls become bonded to the pads on cooling of the solder.

Several arrangements may be implemented to load the socket 102 separately from a heat sink 108. In one example, one or more spring clips 110A, 110B may be used as the attachment element and configured to directly couple the Socket BGA 102 to the circuit substrate 106. The spring clips 110A, 110B engage with holes on the circuit substrate 106 and extend over the periphery of the socket 102 and apply the load separately and independently of the heat sink 108. The spring clips 110A, 110B are constructed of materials with suitable strength and elasticity to apply a selected compressive load between the socket 102 and circuit substrate 106. The spring clips 110A, 110B are used as part of a simple structure, facilitating assembly.

A heat sink and integrated circuit assembly 112 adapted to hold the integrated circuit 104 and the Socket BGA 102, separated by an interposed gap 114 such that the Socket BGA 102 is loaded separately from the heat sink and integrated circuit assembly 112.

In a particular embodiment, the Socket BGA 102 may be a zero insertion force (ZIF) socket, which is configured to accept an integrated circuit chip such as a pin grid array (PGA) chip. The ZIF socket enables attachment of the integrated circuit 104 without applied pressure, avoiding the risk of bending integrated circuit interface pins for integrated circuit chips that are potentially highly expensive.

Referring to FIG. 1C, the pictorial diagram illustrates an embodiment of an assembly 120 which is adapted to hold the interface 100. The substrate 106, depicted as a printed circuit board, is adapted for coupling to the heat sink frame 122. The socket BGA 102 couples to the printed circuit board 106 with a compressive load that is isolated from the heat sink frame 122 through a rigid connection to the printed circuit board 106. In the illustrative embodiment, the heat sink frame 122 is shown as heat sink/processor field replaceable unit. The heat sink frame 122 is adapted to hold the heat sink 108 and one or more spring elements which function as attachment elements and apply a spring force directly to the Socket BGA 102.

Figure 2A:
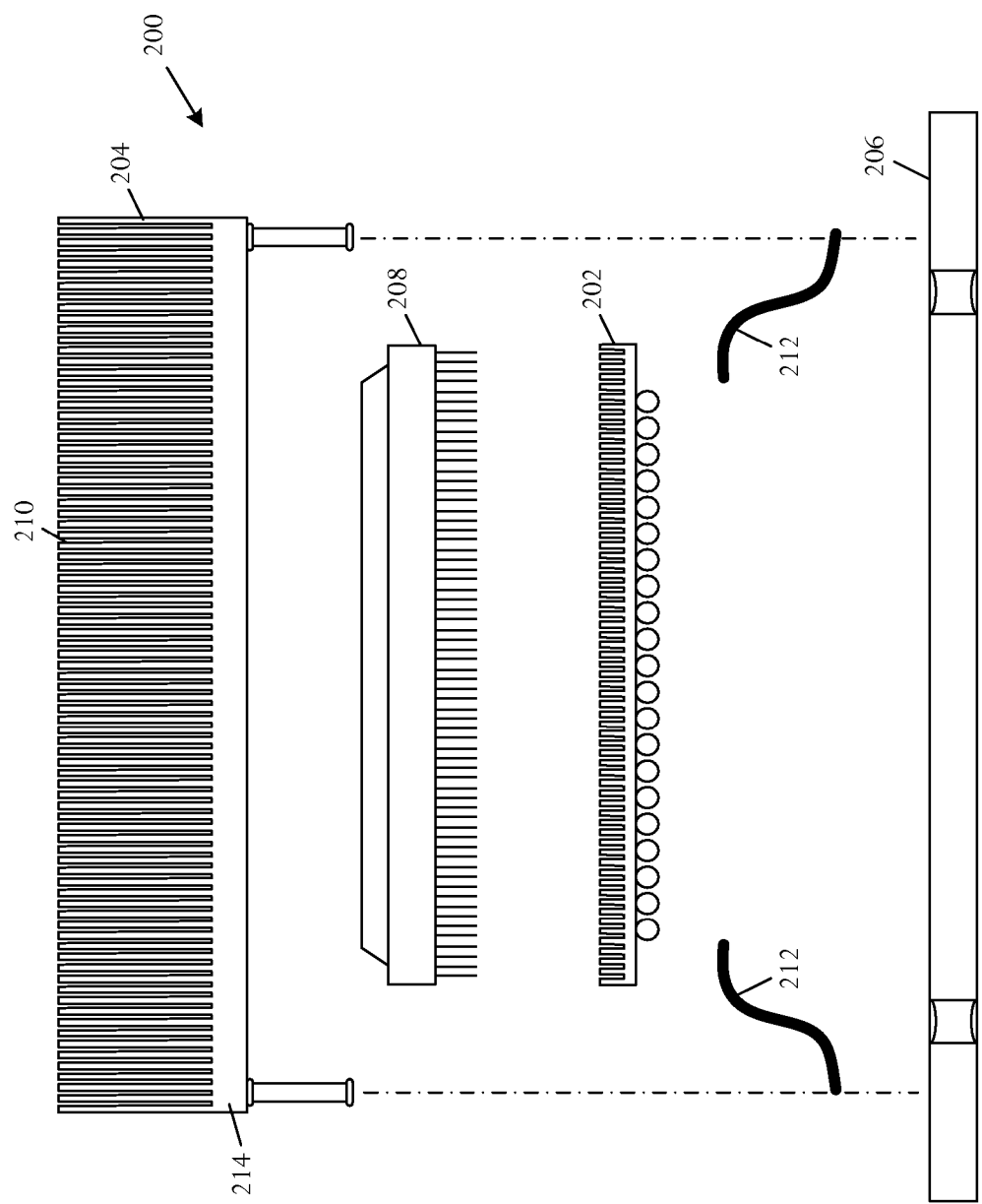
FIGS. 2A, 2B, and 2C are perspective pictorial diagrams illustrating exploded and assembled views of an embodiment of an electronic assembly that includes a socket with compressive loading to the assembly.
Figure 2B:
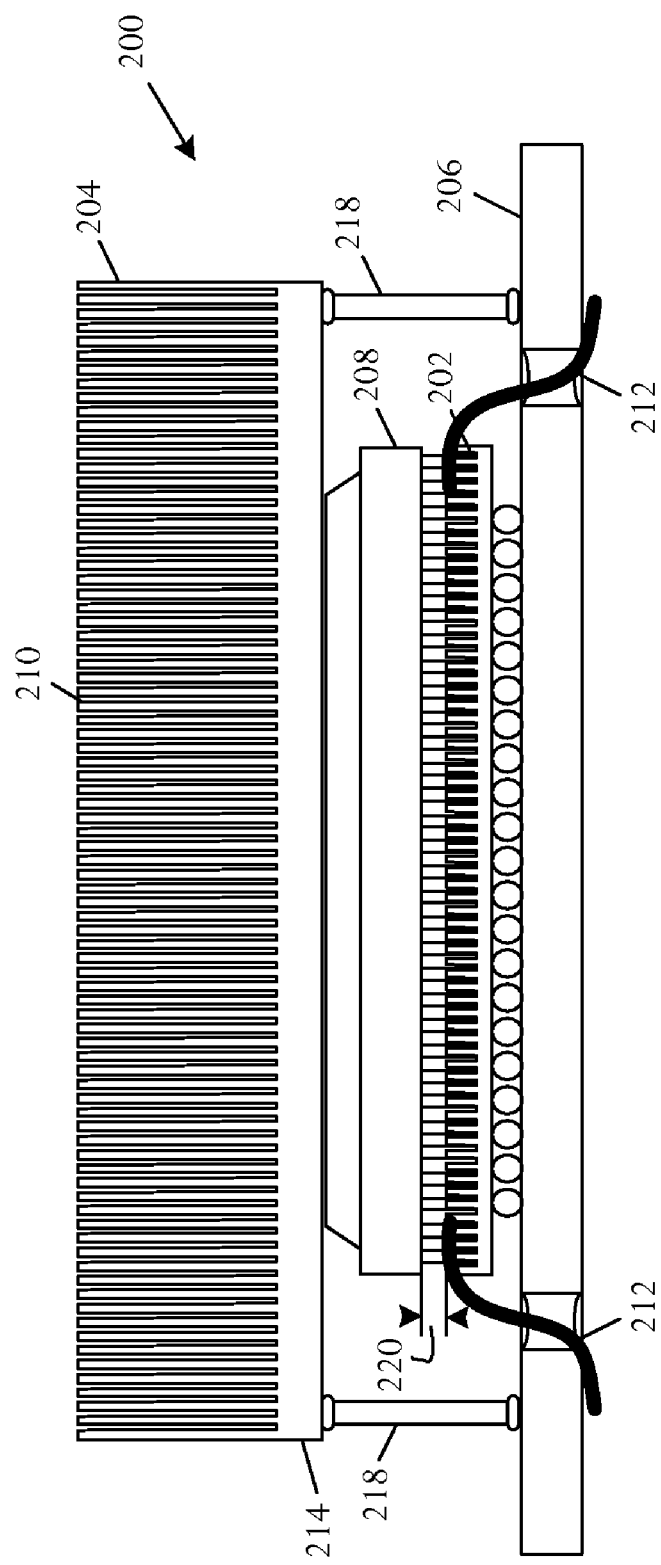
Figure 2C:
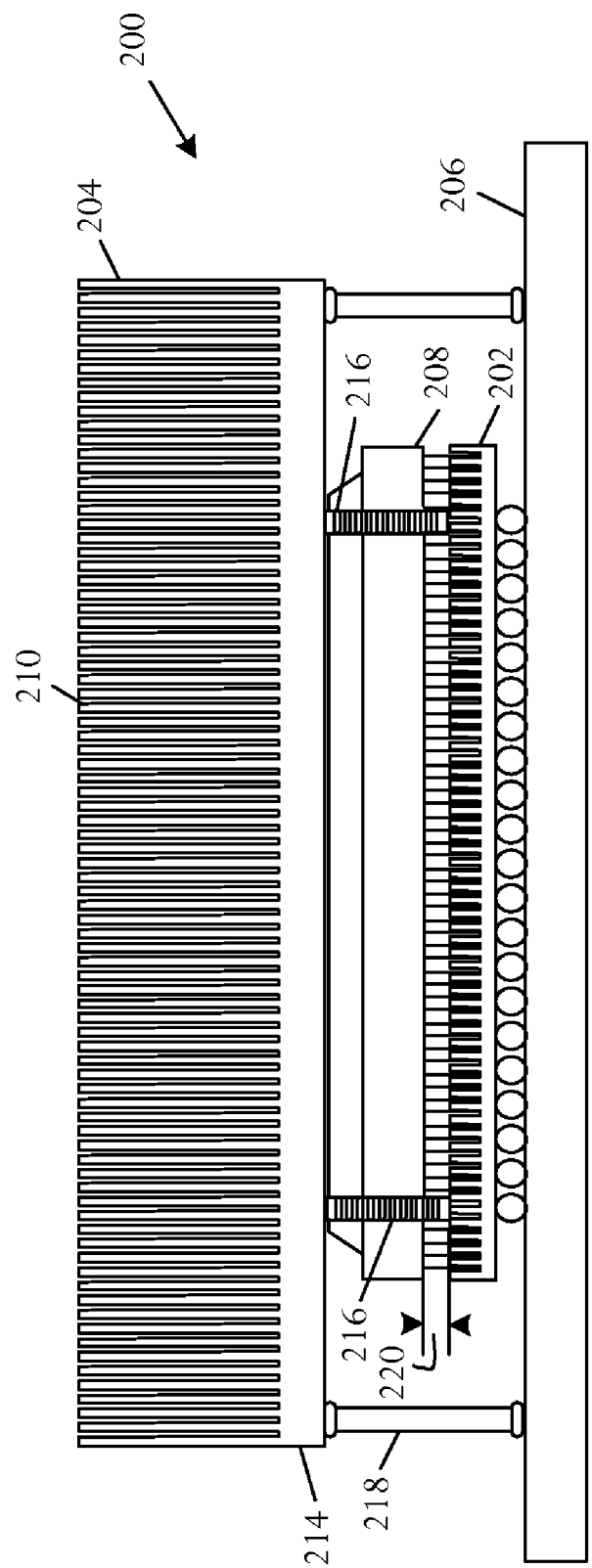

Referring to FIGS. 2A, 2B, and 2C, perspective pictorial diagrams illustrate an embodiment of an electronic assembly 200 that includes a socket 202 with compressive loading to the assembly 200. FIGS. 2A and 2B respectively depict an exploded side view and an assembled side view of the assembly 200. The electronic assembly 200 comprises a heat sink/processor field replaceable unit 204 that assembles to a printed circuit board 206. The electronic assembly 200 further comprises the socket 202 which is adapted to receive and electrically connect to an integrated circuit 208, for example a processor, in the heat sink/processor field replaceable unit 204. The socket 202 couples to the printed circuit board 206 with a compressive load that is isolated from the heat sink/processor field replaceable unit 204. Isolating the heat sink/processor field replaceable unit 204 from the socket 202 avoids damage to the processor 208 and/or socket 202 from shock and vibration, and may reduce operating and manufacturing costs. Additionally, isolating the heat sink/processor field replaceable unit 204 from the socket 202 enables the field replaceable unit to be "hard-mounted" to the printed circuit board 206, eliminating usage of springs to attach the heat sink, thereby reducing cost and complexity.

In a specific embodiment, FIGS. 2A, 2B, and 2C illustrate a cross-section of a computer chip 208 with a lid mounted onto the printed circuit board 206 that operates to disseminate signals to a system board and to supply power.

In some embodiments, the socket 202 may be a ball grid array (BGA) socket adapted to receive and electrically connect to the integrated circuit 208 which is disposed between the printed circuit board 206 and a heat sink 210 in the heat sink/processor field replaceable unit 204. An attachment element 212 is adapted to hold the Socket BGA to the printed circuit board 206 with a compressive load which is isolated from the heat sink 210. The heat sink/processor field replaceable unit 204 has a heat sink frame 214 holding the heat sink 210.

In various embodiments, the attachment member 212 may be configured in one or more of several forms. For example, the attachment member 212 may include one or more spring clips that directly apply a compressive load holding the socket 202 to the printed circuit board 206. One implementation includes apertures formed into the printed circuit board 206 and metal or plastic elastic spring clips have a configuration with sharp bends or other locking structures that engage with the board in the vicinity of the apertures to hold the socket 202 with the compressive load. Another implementation includes screws for attaching spring clips to the board. Other configurations may have spring clips soldered to the printed circuit board 206.

The heat sink frame 214 may have members 218 adapted to hard mount the heat sink 210 to the printed circuit board 206 or to other stable elements in a system, for example to a chassis, to isolate the heat sink 210 from the processor 208 and socket 202. Hard mounting of the heat sink frame 214 to the board 206 eliminates attachment elements such as spring screws.

In other embodiments, for example the assembly 200 shown as an assembled side view in FIG. 2C, the attachment member 212 includes one or more spring elements 216 attached to the heat sink frame 214 which apply a spring force directly to the socket 202.

The heat sink/processor field replaceable unit 204 may have a configuration that holds and maintains a gap separation 220 between the processor 208 and socket 202, ensuring that the socket 202 is loaded separately from the heat sink/processor field replaceable unit 204.

In some embodiments, the socket 202 may be a zero insertion force (ZIF) socket.

Figure 3A:
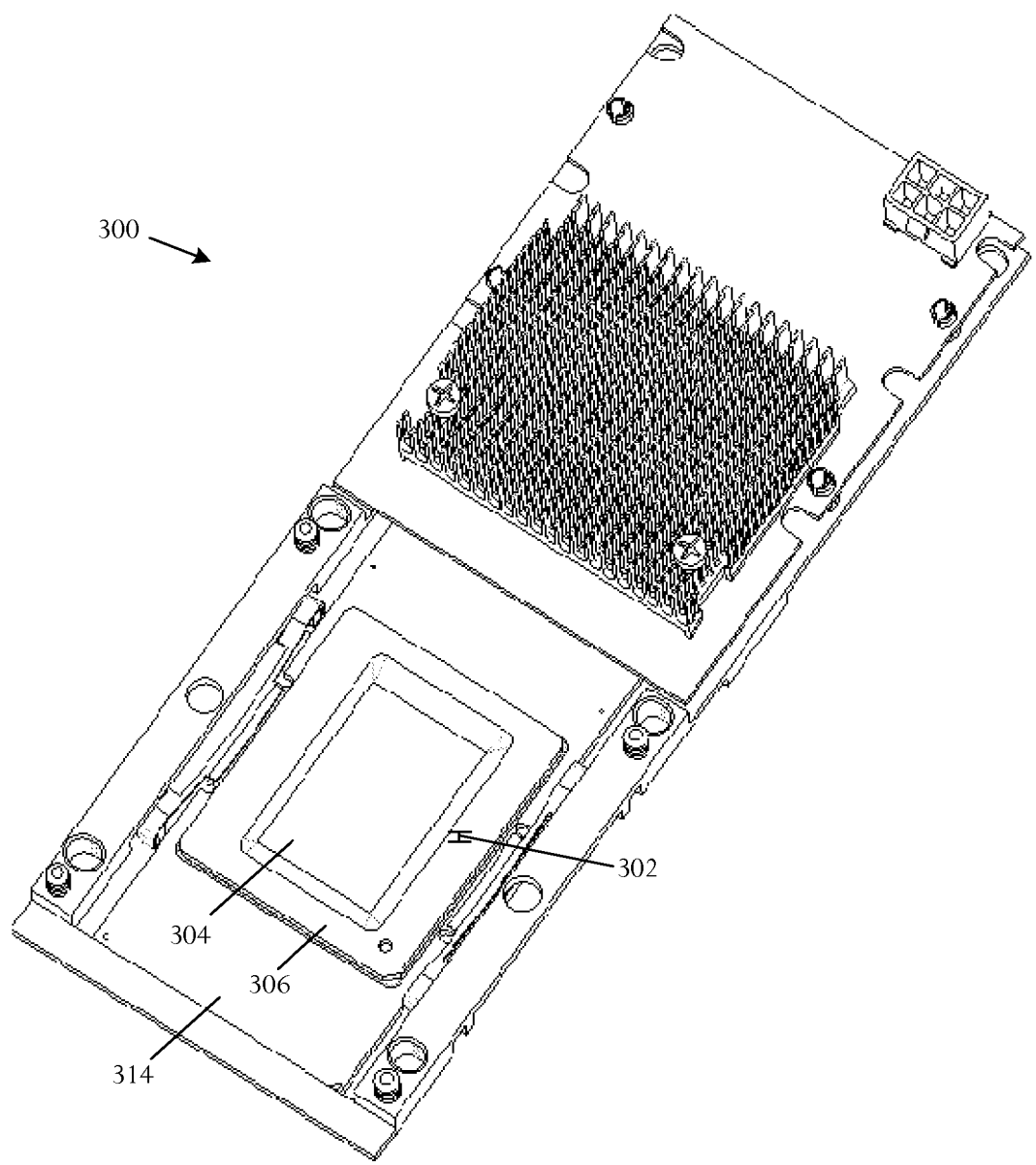
FIGS. 3A through 3F are various schematic pictorial diagrams depicting an embodiment of an electronic assembly configured to hold and maintain a gap between a processor and socket.
Figure 3B:
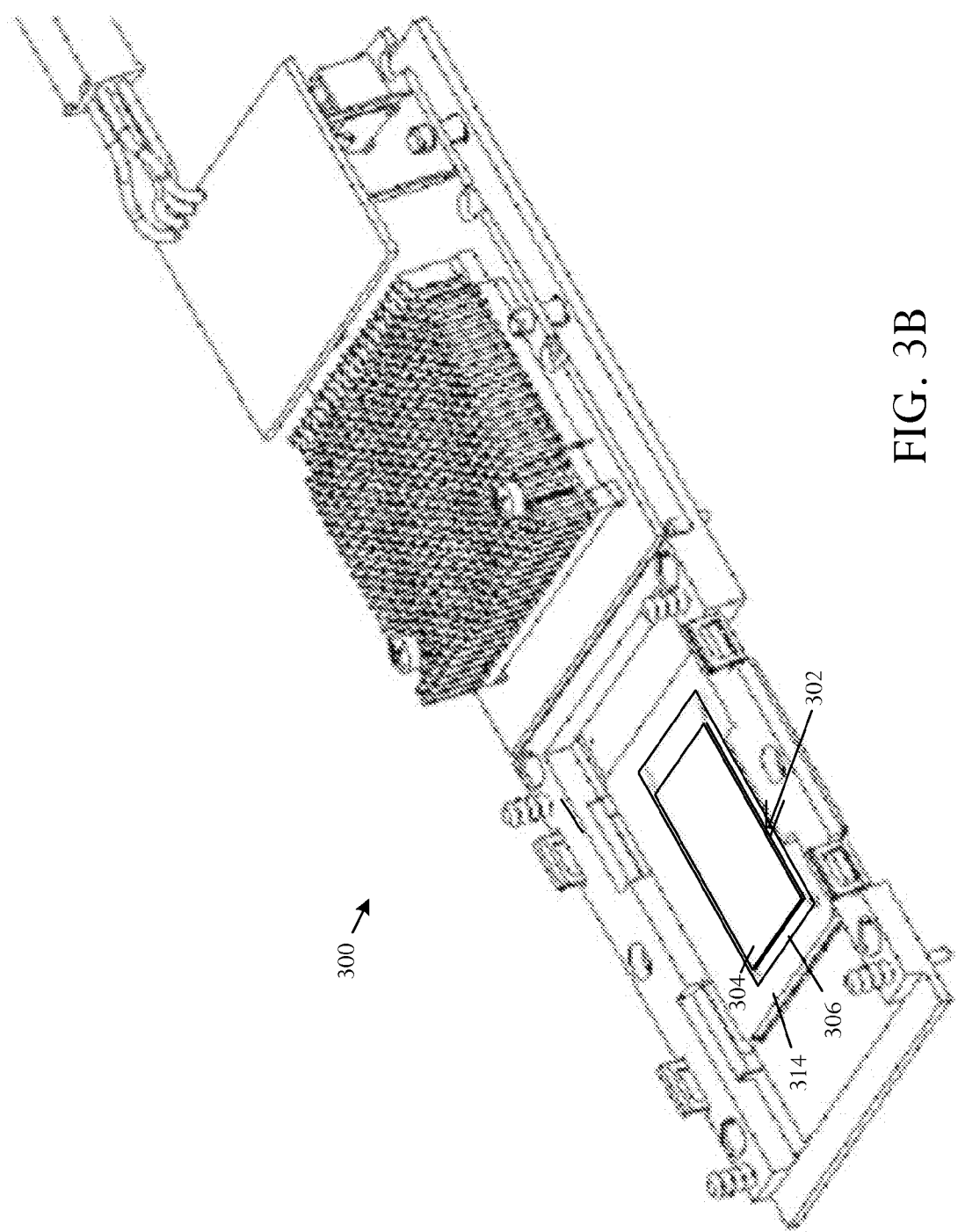
Figure 3C:
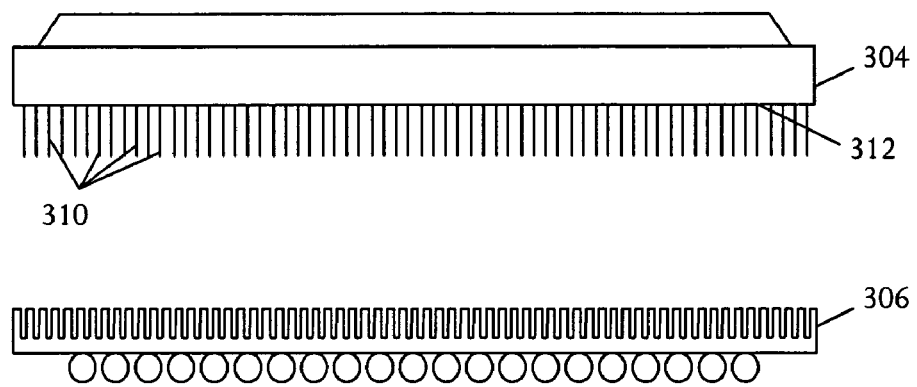
Figure 3D:
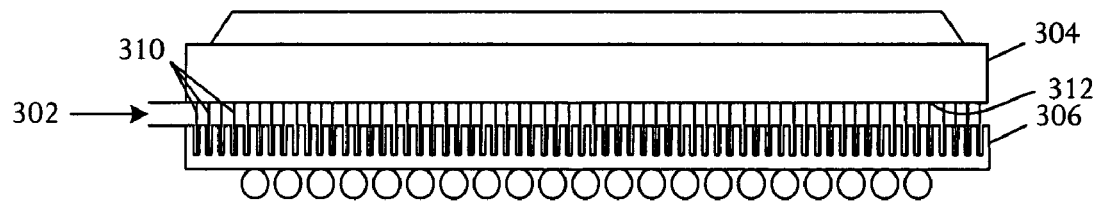
Figure 3E:
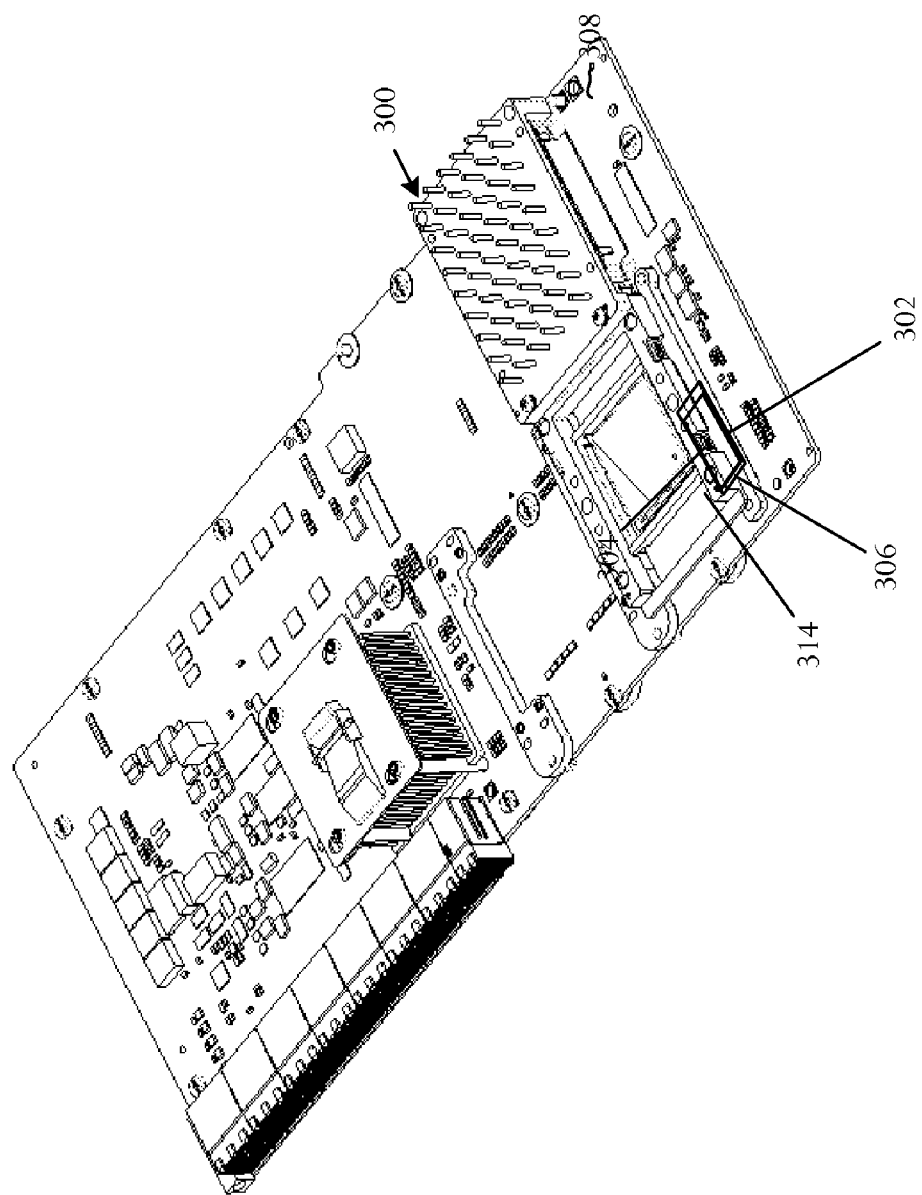
Figure 3F:
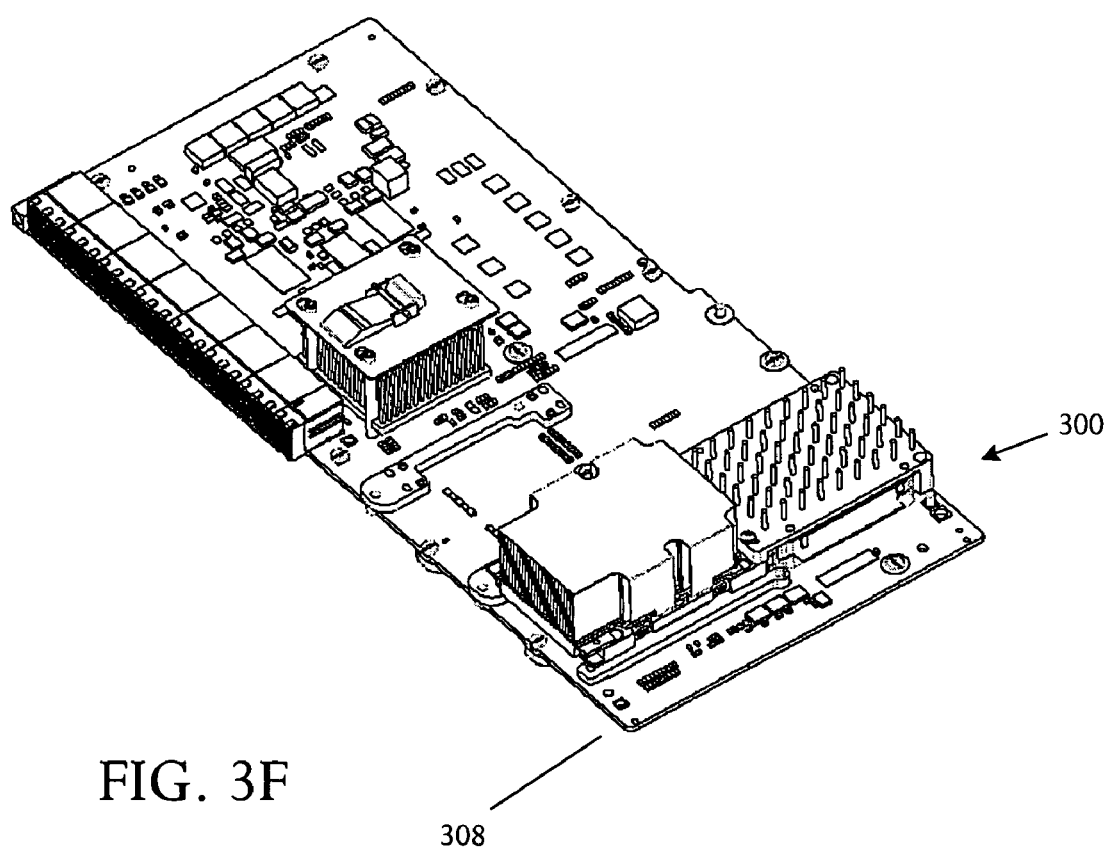

Referring to FIGS. 3A through 3F, various schematic pictorial diagrams illustrate an embodiment of an electronic assembly 300 configured to hold and maintain a gap 302 between a processor 304 and socket 306. FIGS. 3A and 3B are perspective pictorial diagrams respectively showing embodiments of field replaceable units 300A and 300B in a configuration maintaining the processor-socket gap 302. FIGS. 3C and 3D are pictorial side views respectively showing exploded and assembled views of the processor 304 and the socket 306. FIGS. 3E and 3F depict and application-specific electronic assembly 301 omitting and including a heat sink/processor field replaceable unit 308, respectively.

The gap 302 isolates the heat sink from the processor 304 and socket 306, protecting potential fragile components from damage in a shock event. The gap 302 also reduces tolerance requirements for the heat sink and associated retention components and hardware, allowing variability in manufacturing that can reduce costs and enabling usage of different component models. In contrast, in attachment designs that specifically call for contact between a processor daughter card and the socket, a design tolerance loop is carefully controlled to prevent significant tolerance-driven microprocessor load variations, adding cost and complexity.

The electronic assembly 300 comprises a heat sink/processor field replaceable unit 308 and the socket 306. The socket 306 couples to the heat sink/processor field replaceable unit 308 and receives and electrically connects to the processor 304 in the heat sink/processor field replaceable unit 308. The heat sink/processor field replaceable unit 308 and socket 306 are configured to form the gap 302 between processor 304 in the heat sink/processor field replaceable unit 308 and the socket 306, isolating heat sink mass from both the processor 304 and the socket 306.

Multiple surface-mounted pins 310 are formed on a planar surface 312 of the processor 304 and slip into and engage with corresponding multiple holes in the socket 306 to form an electrical connection between the processor 304 and the socket 306. In an illustrative embodiment, the heat sink/ processor field replaceable unit 308 defines a gap that approximates the pin length of the surface-mounted pins 310.

Some processors, for example the Montecito Itanium™ processor manufactured by Intel Corporation of Santa Clara, Calif., has an array of surface-mounted pins for electrically connecting between a processor daughter card and a socket on a system board. In the illustrative example, the pins insert into a zero-insertion force (ZIF) socket and have an approximate length of 3 mm. Other processors, socket structures, and pin lengths may be implemented in other embodiments.

A suitable heat sink attachment structure uses the pin length to define and create the gap between the processor daughter card and the socket even under worst-case mechanical tolerance conditions.

A printed circuit board 314 couples to the heat sink/ processor field replaceable unit 308 with the socket 306 connecting to the printed circuit board 314 with a compressive load that is isolated from the heat sink/processor field replaceable unit 308.

The illustrative structures and arrangements exemplify thermo-mechanical configurations that may attain a combination of socket-processor gap and independent socket loading.

Figure 4:
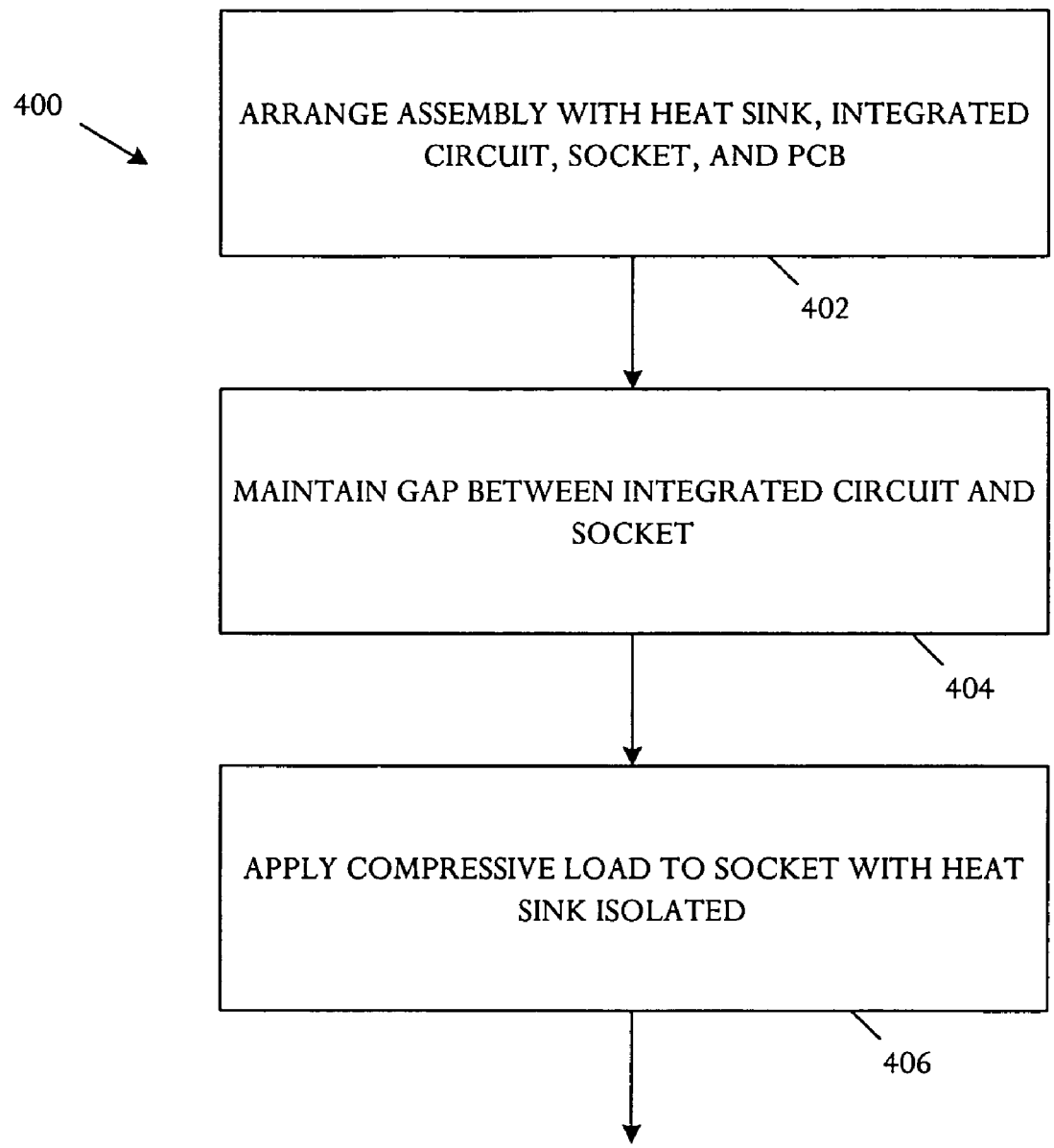
FIG. 4 is a flow chart showing an embodiment of a method 400 for configuring an integrated circuit-socket assembly.

Referring to FIG. 4, a flow chart depicts an embodiment of a method 400 for configuring an integrated circuit-socket assembly. The method 400 comprises arranging 402 an assembly including a heat sink, an integrated circuit, a socket, and a printed circuit board. A gap separation is maintained 404 between the integrated circuit and the socket. A compressive load is applied 406 holding the socket to the printed circuit board whereby mass of the heat sink is isolated from the processor and the socket.

The method 400 may be used to enable compressive socket BGA loading.

In an illustrative embodiment, the integrated circuit is a processor with an array of pins 3 mm in length engage the sock, thereby maintaining 404 the gap separation. Spring clips may be used to deliver loading 406 on the socket and enable freedom in structuring a heat sink/processor assembly, for example to separate a processor and the socket by a gap, thereby promoting reliability. Loading 406 applies compressive force to ball grid array balls to enable more reliable electrical contact between the socket and circuit substrate. The mechanical design enables optimal isolation between the heat sink and the processor, a desirable condition since the heat sink assembly is typically heavy, for example 1 kilogram or more although smaller heat sinks may also be used. A heat sink that is not isolated from the processor and socket, for example a heat sink that is compressively attached to the socket, under a shock condition may impose a very large, potentially crushing, gravity-force to balls of the ball grid array.

The illustrative method exploits the pin length to form and maintain 404 the gap while applying 406 a compressive force between the socket and circuit substrate. The compressive force is applied 406 in a manner that physically isolates the potentially fragile integrated circuit and socket from the heavy mass of the heat sink.

While the present disclosure describes various embodiments, these embodiments are to be understood as illustrative and do not limit the claim scope. Many variations, modifications, additions and improvements of the described embodiments are possible. For example, those having ordinary skill in the art will readily implement the steps necessary to provide the structures and methods disclosed herein, and will understand that the process parameters, materials, and dimensions are given by way of example only. The parameters, materials, and dimensions can be varied to achieve the desired structure as well as modifications, which are within the scope of the claims. Variations and modifications of the embodiments disclosed herein may also be made while remaining within the scope of the following claims. For example, various other types of springs or connectors may be implemented to apply the compressive force to the socket. Similarly, the various springs or connectors may be positioned in any suitable location, not only on the printed circuit board or substrate.

What is claimed is:

1. An interface comprising:
   a ball grid array (BGA) socket adapted to receive and electrically connect to an integrated circuit disposed between a circuit substrate and a heat sink; and
   an attachment element adapted to hold the BGA socket to the circuit substrate in a configuration that maintains a gap between the integrated circuit and the BGA socket and imposes a compressive load on the BGA socket that is isolated from the integrated circuit and the heat sink.

2. The interface according to claim 1 further comprising:
   at least one clip operative as the attachment element and configured to directly couple the BGA socket to the circuit substrate.

3. The interface according to claim 1 further comprising:
   a heat sink frame adapted to hold the heat sink; and
   at least one spring element operative as the attachment element and configured to apply a spring force directly to the BGA socket.

4. The interface according to claim 1 further comprising:
   a heat sink and integrated circuit assembly adapted to hold the integrated circuit and BGA socket with the gap between the integrated circuit and the BGA socket.

5. The interface according to claim 1 further comprising:
   a heat sink and integrated circuit assembly adapted to hold the integrated circuit and BGA socket with the gap between the integrated circuit and the BGA socket is loaded separately from the heat sink and integrated circuit assembly.

6. The interface according to claim 1 further comprising:
   a zero insertion force (ZIF) socket operative as the BGA socket; and
   a heat sink and integrated circuit assembly adapted to hold the integrated circuit and ZIF socket with an interposed gap separation whereby the ZIF socket is loaded separately from the heat sink and integrated circuit assembly.

7. An electronic assembly comprising:
   a heat sink/processor field replaceable unit;
   a printed circuit board adapted for coupling to the heat sink/processor field replaceable unit; and
   a socket adapted to receive and electrically connect to a processor in the heat sink/processor field replaceable unit and couple to the printed circuit board in a configuration that maintains a gap between the integrated circuit and the socket and imposes a compressive load on the BGA socket that is isolated from the heat sink/processor field replaceable unit.

8. The electronic assembly according to claim 7 further comprising:
the socket comprising a ball grid array (BGA) socket adapted to receive and electrically connect to the processor disposed between the printed circuit board and a heat sink in the heat sink/processor field replaceable unit; and
an attachment element adapted to hold the BGA socket to the printed circuit board in a configuration that maintains a gap between the integrated circuit and the BGA socket and imposes a compressive load on the BGA socket that is isolated from the integrated circuit and the heat sink.

9. The electronic assembly according to claim 8 further comprising:
at least one clip operative as the attachment element and configured to directly couple the BGA socket to the printed circuit board.

10. The electronic assembly according to claim 8 further comprising:
a heat sink frame adapted to hold the heat sink; and
at least one spring element operative as the attachment element and configured to apply a spring force directly to the BGA socket.

11. The electronic assembly according to claim 7 wherein:
the heat sink/processor field replaceable unit is adapted to hold the processor and socket with the gap between the integrated circuit and the BGA socket.

12. The electronic assembly according to claim 7 wherein:
the heat sink/processor field replaceable unit is adapted to hold the processor and socket with the gap between the integrated circuit and the BGA socket whereby the socket is loaded separately from the heat sink/processor field replaceable unit.

13. The electronic assembly according to claim 7 further comprising:
a zero insertion force (ZIF) socket operative as the socket; whereby
the heat sink/processor field replaceable unit is adapted to hold the processor and ZIF socket with the gap between the integrated circuit and the BGA socket whereby the ZIF socket is loaded separately from the heat sink/processor field replaceable unit.

14. An electronic assembly comprising:
a heat sink/processor field replaceable unit; and
a socket adapted to couple to the heat sink/processor field replaceable unit and receive and electrically connect to a processor in the heat sink/processor field replaceable unit, the heat sink/processor field replaceable unit and socket being configured to form a gap between a processor in the heat sink/processor field replaceable unit and the socket whereby heat sink mass is isolated from the processor and the socket.

15. The electronic assembly according to claim 14 further comprising:
multiple surface-mounted pins coupled to a planar surface of the processor and forming an electrical connection between the processor and the socket.

16. An electronic assembly according to claim 14 further comprising:
a printed circuit board adapted for coupling to the heat sink/processor field replaceable unit, the socket coupling to the printed circuit board with a compressive load that is isolated from the heat sink/processor field replaceable unit through a rigid connection to the printed circuit board.

17. The electronic assembly according to claim 16 further comprising:
a ball grid array (BGA) socket adapted to receive and electrically connect to the processor disposed between the printed circuit board and a heat sink in the heat sink/processor field replaceable unit; and
an attachment element adapted to hold the BGA socket to the printed circuit board with a compressive load isolated from the heat sink.

18. The electronic assembly according to claim 17 further comprising:
at least one clip operative as the attachment element and configured to directly couple the BGA socket to the printed circuit board.

19. The electronic assembly according to claim 17 further comprising:
a heat sink frame adapted to hold the heat sink; and
at least one spring element operative as the attachment element and configured to apply a spring force directly to the BGA socket.

20. The electronic assembly according to claim 14 wherein:
the heat sink/processor field replaceable unit is adapted to hold the processor and socket with the gap between the integrated circuit and the socket whereby the socket is loaded separately from the heat sink/processor field replaceable unit.

21. The electronic assembly according to claim 14 further comprising:
a zero insertion force (ZIF) socket operative as the socket; whereby
the heat sink/processor field replaceable unit is adapted to hold the processor and ZIF socket with the gap between the integrated circuit and the BGA socket whereby the ZIF socket is loaded separately from the heat sink/processor field replaceable unit.

22. A method for configuring an integrated circuit-socket assembly comprising:
arranging an assembly including a heat sink, an integrated circuit, a socket, and a printed circuit board;
maintaining a gap separation between the integrated circuit and the socket; and
applying a compressive load holding the socket to the printed circuit board whereby mass of the heat sink is isolated from the processor and the socket.

* * * * *